(12) United States Patent
Huynh

(10) Patent No.: US 9,678,126 B2
(45) Date of Patent: Jun. 13, 2017

(54) SYSTEM AND METHOD FOR TESTING RADIO FREQUENCY WIRELESS SIGNAL TRANSCEIVERS USING WIRELESS TEST SIGNALS

(71) Applicant: LITEPOINT CORPORATION, Sunnyvale, CA (US)

(72) Inventor: Minh-Chau Huynh, San Mateo, CA (US)

(73) Assignee: LitePoint Corporation, Sunnyvale, CA (US)

( * ) Notice: Subject to any disclaimer, the term of this patent is extended or adjusted under 35 U.S.C. 154(b) by 626 days.

(21) Appl. No.: 13/839,583

(22) Filed: Mar. 15, 2013

(65) Prior Publication Data

US 2014/0266930 A1  Sep. 18, 2014

(51) Int. Cl.
- *G01R 29/10* (2006.01)
- *H04B 17/391* (2015.01)
- *H04B 7/0413* (2017.01)

(52) U.S. Cl.
CPC ......... *G01R 29/10* (2013.01); *H04B 17/3911* (2015.01); *H04B 7/0413* (2013.01)

(58) Field of Classification Search
USPC ............ 343/703, 702, 882; 455/67.11, 226.1
See application file for complete search history.

(56) References Cited

U.S. PATENT DOCUMENTS

| | | | |
|---|---|---|---|
| 7,167,133 B2 * | 1/2007 | Nagashima | G01R 29/10 324/637 |
| 7,599,618 B2 | 10/2009 | Adam et al. | |
| 8,138,778 B1 | 3/2012 | Smith | |
| 2003/0003883 A1 | 1/2003 | Wallace et al. | |
| 2007/0201577 A1 | 8/2007 | Vasil'evich et al. | |
| 2007/0243826 A1 | 10/2007 | Liu | |
| 2007/0285109 A1 | 12/2007 | Niayesh et al. | |
| 2008/0150792 A1 | 6/2008 | Stayton et al. | |
| 2010/0285753 A1 | 11/2010 | Foegelle | |
| 2010/0308856 A1 | 12/2010 | Watanabe et al. | |
| 2011/0084887 A1 | 4/2011 | Mow et al. | |
| 2011/0275329 A1 * | 11/2011 | Foegelle | H04W 24/00 455/67.12 |
| 2012/0100813 A1 | 4/2012 | Mow et al. | |

(Continued)

OTHER PUBLICATIONS

U.S. Appl. No. 13/912,410, filed Jun. 7, 2013, Titled "System and Method for Testing Radio Frequency Wireless Signal Transceivers Using Wireless Test Signals".
U.S. Appl. No. 13/912,416, filed Jun. 7, 2013, Titled "System and Method for Testing Radio Frequency Wireless Signal Transceivers Using Wireless Test Signals".
U.S. Appl. No. 13/912,423, filed Jun. 7, 2013, Titled "System and Method for Testing Radio Frequency Wireless Signal Transceivers Using Wireless Test Signals".

(Continued)

*Primary Examiner* — Hoang Nguyen
*Assistant Examiner* — Hai Tran
(74) *Attorney, Agent, or Firm* — Banner & Witcoff, Ltd.

(57) ABSTRACT

A system and method to facilitate wireless testing of a radio frequency (RF) signal transceiver device under test (DUT). With the DUT operating in a controlled electromagnetic environment, the tester exchanges multiple test signals wirelessly with the DUT. Signal phases of the respective test signals are controlled in accordance with feedback signals from the DUT and test equipment. Magnitudes of the respective test signals can also be controlled in accordance with such feedback signals, thereby enabling minimizing of apparent signal path loss between the tester and DUT to effectively simulate an electrically conductive signal path.

20 Claims, 9 Drawing Sheets

(56) References Cited

U.S. PATENT DOCUMENTS

2012/0274345 A1   11/2012   Chen et al.
2012/0275506 A1   11/2012   Ding et al.
2013/0027256 A1    1/2013   Guo et al.

OTHER PUBLICATIONS

"MIMO Performance and Condition Number in LTE Test" by Agilent Technologies, Published Oct. 5, 2009; 14 Pages.
U.S. Appl. No. 13/839,162, filed Mar. 15, 2013 "System and Method for Testing Radio Frequency Wireless Signal Transceivers Using Wireless Test Signals".
International Search Report and Written Opinion in PCT/US2014/038351 issued on Sep. 26, 2014, 10 pgs.
International Search Report and Written Opinion in PCT/US2014/038338 issued on Sep. 23, 2014, 10 pgs.
International Search Report and Written Opinion in PCT/US2014/038372 issued on Sep. 23, 2014, 14 pgs.
International Search Report and Written Opinion filed in PCT/US2014/019865 dated Jul. 18, 2014; 14 pgs.
International Preliminary Report on Patentability filed in PCT/US2014/019865; issued on Sep. 15, 2015; 11 pages.
International Preliminary Report on Patentabiiity filed in PCT/US2014/019912; issued on Sep. 15, 2015; 10 pages.
International Preliminary Report on Patentability filed in PCT/US2014/038372 dated Dec. 8. 2015; 11 pgs.
International Preliminary Report on Patentability filed in PCT/US2014/038351 dated Dec. 8, 2015; 7 pgs.

* cited by examiner

SYSTEM AND METHOD FOR TESTING RADIO FREQUENCY WIRELESS SIGNAL TRANSCEIVERS USING WIRELESS TEST SIGNALS

BACKGROUND

The present invention relates to testing of radio frequency (RF) wireless signal transceivers, and in particular, to testing such devices without a need for RF signal cables for conveyance of RF test signals.

Many of today's electronic devices use wireless technologies for both connectivity and communications purposes. Because wireless devices transmit and receive electromagnetic energy, and because two or more wireless devices have the potential of interfering with the operations of one another by virtue of their signal frequencies and power spectral densities, these devices and their wireless technologies must adhere to various wireless technology standard specifications.

When designing such devices, engineers take extraordinary care to ensure that such devices will meet or exceed each of their included wireless technology prescribed standard-based specifications. Furthermore, when these devices are later being manufactured in quantity, they are tested to ensure that manufacturing defects will not cause improper operation, including their adherence to the included wireless technology standard-based specifications.

For testing these devices following their manufacture and assembly, current wireless device test systems ("testers") employ a subsystem for analyzing signals received from each device. Such subsystems typically include at least a vector signal generator (VSG) for providing the source signals to be transmitted to the device, and a vector signal analyzer (VSA) for analyzing signals produced by the device. The production of test signals by the VSG and signal analyses performed by the VSA are generally programmable so as to allow each to be used for testing a variety of devices for adherence to a variety of wireless technology standards with differing frequency ranges, bandwidths and signal modulation characteristics.

Calibration and performance verification testing of a device under test (DUT) are typically done using electrically conductive signal paths, such as RF cables, rather than wireless signal paths, by which a DUT and tester communicate via electromagnetic radiation. Accordingly, the signals between the tester and DUT are conveyed via the conductive signal path rather than being radiated through ambient space. Using such conductive signal paths helps to ensure repeatability and consistency of measurements, and eliminates positioning and orientation of the DUT as a factor in signal conveyance (transmission and reception).

In the case of a multiple input, multiple output (MIMO) DUT, a signal path must be provided, in some form, for each input/output connection of the DUT. For example, for a MIMO device intended to operate with three antennas, three conductive signal paths, e.g., cables and connections, must be provided for testing.

However, using conductive signal paths significantly impacts the time needed for testing each DUT due to the need for physically connecting and disconnecting the cables between the DUT and tester. Further, in the case of a MIMO DUT, multiple such connecting and disconnecting actions must be performed, both at the beginning and termination of testing. Further, since the signals being conveyed during testing are not radiated via the ambient space, as they would be in the normally intended use, and the antenna assemblies for the DUT are not in use during such testing, such testing does not simulate real world operation and any performance characteristics attributable to the antennas are not reflected in the test results.

As an alternative, testing could be done using test signals conveyed via electromagnetic radiation rather than electrical conduction via cables. This would have the benefit of requiring no connecting and disconnecting of test cables, thereby reducing the test time associated with such connections and disconnections. However, the "channel" in which the radiated signals and receiver antennas exist, i.e., the ambient space through which the test signals are radiated and received, is inherently prone to signal interference and errors due to other electromagnetic signals originating elsewhere and permeating the ambient space. Such signals will be received by the DUT antennas and can include multipath signals from each interfering signal source due to signal reflections. Accordingly, the "condition" of the "channel" will typically be poor compared to using individual conductive signal paths, e.g., cables, for each antenna connection.

One way to prevent, or at least significantly reduce, interference from such extraneous signals, is to isolate the radiated signal interface for the DUT and tester using a shielded enclosure. However, such enclosures have typically not produced comparable measurement accuracy and repeatability. This is particularly true for enclosures that are smaller than the smallest anechoic chambers. Additionally, such enclosures tend to be sensitive to the positioning and orientation of the DUT, as well as to constructive and destructive interference of multipath signals produced within such enclosures.

Accordingly, it would be desirable to have systems and methods for testing wireless signal transceivers, and particularly wireless MIMO signal transceivers, in which radiated electromagnetic test signals can be used, thereby simulating real world system operation as well as avoiding test time otherwise necessary for connecting and disconnecting test cabling, while maintaining test repeatability and accuracy by avoiding interfering signals due to externally generated signals and multipath signal effects.

SUMMARY

In accordance with the presently claimed invention, a system and method to facilitate wireless testing of a radio frequency (RF) signal transceiver device under test (DUT). With the DUT operating in a controlled electromagnetic environment, the tester exchanges multiple test signals wirelessly with the DUT. Signal phases of the respective test signals are controlled in accordance with feedback signals from the DUT and test equipment. Magnitudes of the respective test signals can also be controlled in accordance with such feedback signals, thereby enabling minimizing of apparent signal path loss between the tester and DUT to effectively simulate an electrically conductive signal path.

In accordance with one embodiment of the presently claimed invention, a system to facilitate wireless testing of a radio frequency (RF) signal transceiver device under test (DUT) includes a structure, an electrically conductive signal path, a plurality of antennas and RF signal control circuitry. The structure defines interior and exterior regions with the interior region substantially isolated from electromagnetic radiation originating from the exterior region, with the interior region including: a first interior location configured to allow placement of a DUT; a second interior location distal from the first interior location, and one or more RF absorbent materials disposed substantially lateral to a defined volume between the first and second interior locations. The electrically conductive signal path is to couple to the DUT and convey one or more electrical signals between the interior and exterior regions. The plurality of antennas is disposed at least partially at the second interior location to radiate a plurality of phase-controlled RF test signals. The RF signal control circuitry is coupled to the electrically conductive signal path and the plurality of antennas, and responsive to a plurality of signal data from the DUT related to the plurality of phase-controlled RF test signals and conveyed via the one or more electrical signals, and to a RF test signal by: replicating the RF test signal to provide a plurality of replica RF test signals; and controlling, in accordance with the plurality of signal data, respective phases of at least a portion of the plurality of replica RF test signals to provide the plurality of phase-controlled RF test signals.

In accordance with another embodiment of the presently claimed invention, a method of facilitating wireless testing of a radio frequency (RF) multiple-input, multiple-output (MIMO) signal transceiver device under test (DUT) includes providing a structure, an electrically conductive signal path and a plurality of antennas. The structure defines interior and exterior regions with the interior region substantially isolated from electromagnetic radiation originating from the exterior region, with the interior region including: a first interior location configured to allow placement of a DUT; a second interior location distal from the first interior location; and one or more RF absorbent materials disposed substantially lateral to a defined volume between the first and second interior locations. The electrically conductive signal path is to couple to the DUT and convey one or more electrical signals between the interior and exterior regions. The plurality of antennas is disposed at least partially at the second interior location to radiate a plurality of phase-controlled RF test signals. Further included is responding to a plurality of signal data from the DUT related to the plurality of phase-controlled RF test signals and conveyed via the one or more electrical signals, and to a RF test signal by: replicating the RF test signal to provide a plurality of replica RF test signals; and controlling, in accordance with the plurality of signal data, respective phases of at least a portion of the plurality of replica RF test signals to provide the plurality of phase-controlled RF test signals.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry.

Figure 1:
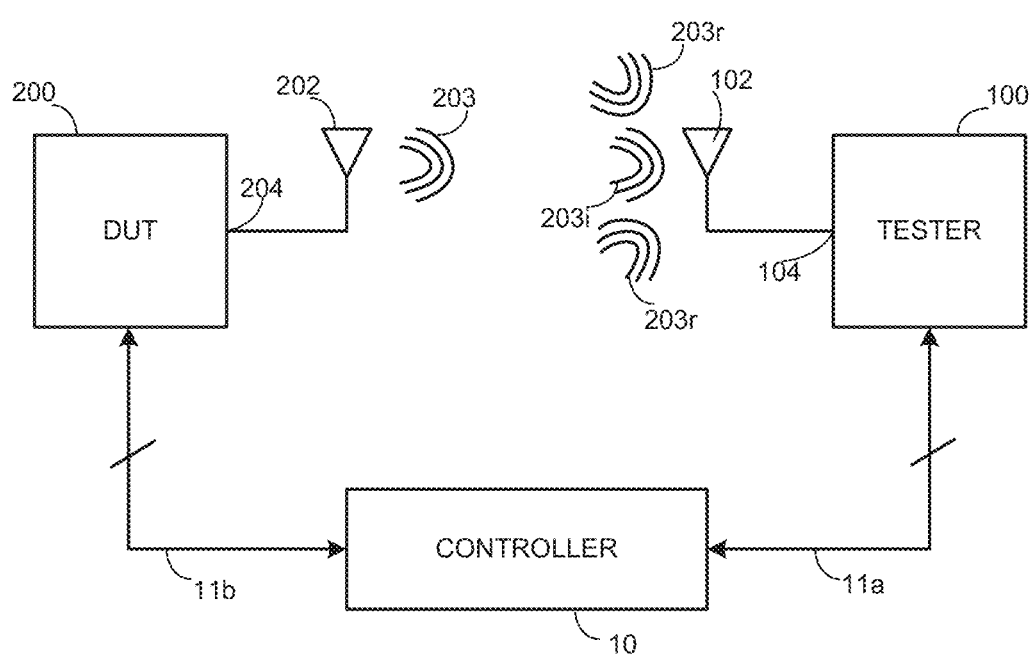
FIG. 1 depicts a typical operating and possible testing environment for a wireless signal transceiver.

Referring to FIG. 1, a typical operating environment, and ideal testing environment for a wireless signal transceiver (at least in terms of simulating real world operation), would have the tester 100 and DUT 200 communicate wirelessly. Typically, some form of test controller 10, (e.g., a personal computer) will also be used to exchange testing commands and data via wired signal interfaces 11*a*, 11*b* with the tester 100 and DUT 200. The tester 100 and DUT 200 each have one (or more for MIMO devices) respective antennas 102, 202, which connect by way of conductive signal connectors 104, 204 (e.g., coaxial cable connections, many types of which are well known in the art). Test signals (source and response) are conveyed wirelessly between the tester 100 and DUT 200 via the antennas 102, 202. For example, during a transmit (TX) test of the DUT 200, electromagnetic signals 203 are radiated from the DUT antenna 202. Depending upon the directivity of the antenna emission pattern, this signal 203 will radiate in numerous directions, resulting in an incident signal component 203*i* and reflected signal components 203*r* being received by the tester antenna 102. As discussed above, these reflected signal components 203*r*, often the products of multipath signal effects as well as other electromagnetic signals originating elsewhere (not shown), result in constructive and destructive signal interference, thereby preventing reliable and repeatable signal reception and testing results.

Figure 2:
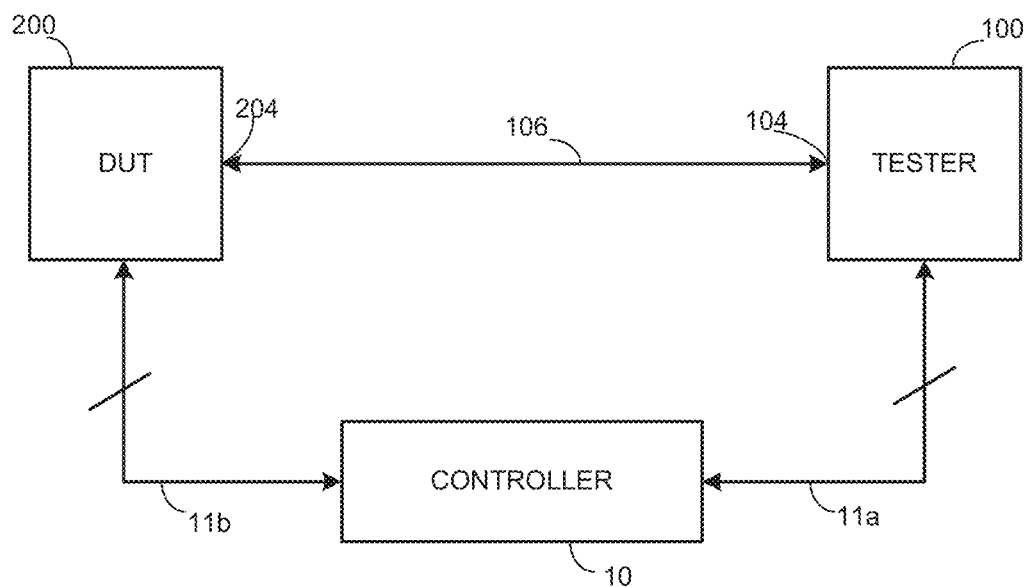
FIG. 2 depicts a testing environment for a wireless signal transceiver using a conductive test signal path.

Referring to FIG. 2, to avoid such unreliable testing results, a conductive signal path, such as a RF coaxial cable 106, is used to connect the antenna connectors 104, 204 of the tester 100 and DUT 200 to provide a consistent, reliable and repeatable electrically conductive signal path for conveyance of the test signals between the tester 100 and DUT 200. As discussed above, however, this increases the overall test time due to the time needed for connecting and disconnecting the cable 106 before and after testing.

Figure 3:
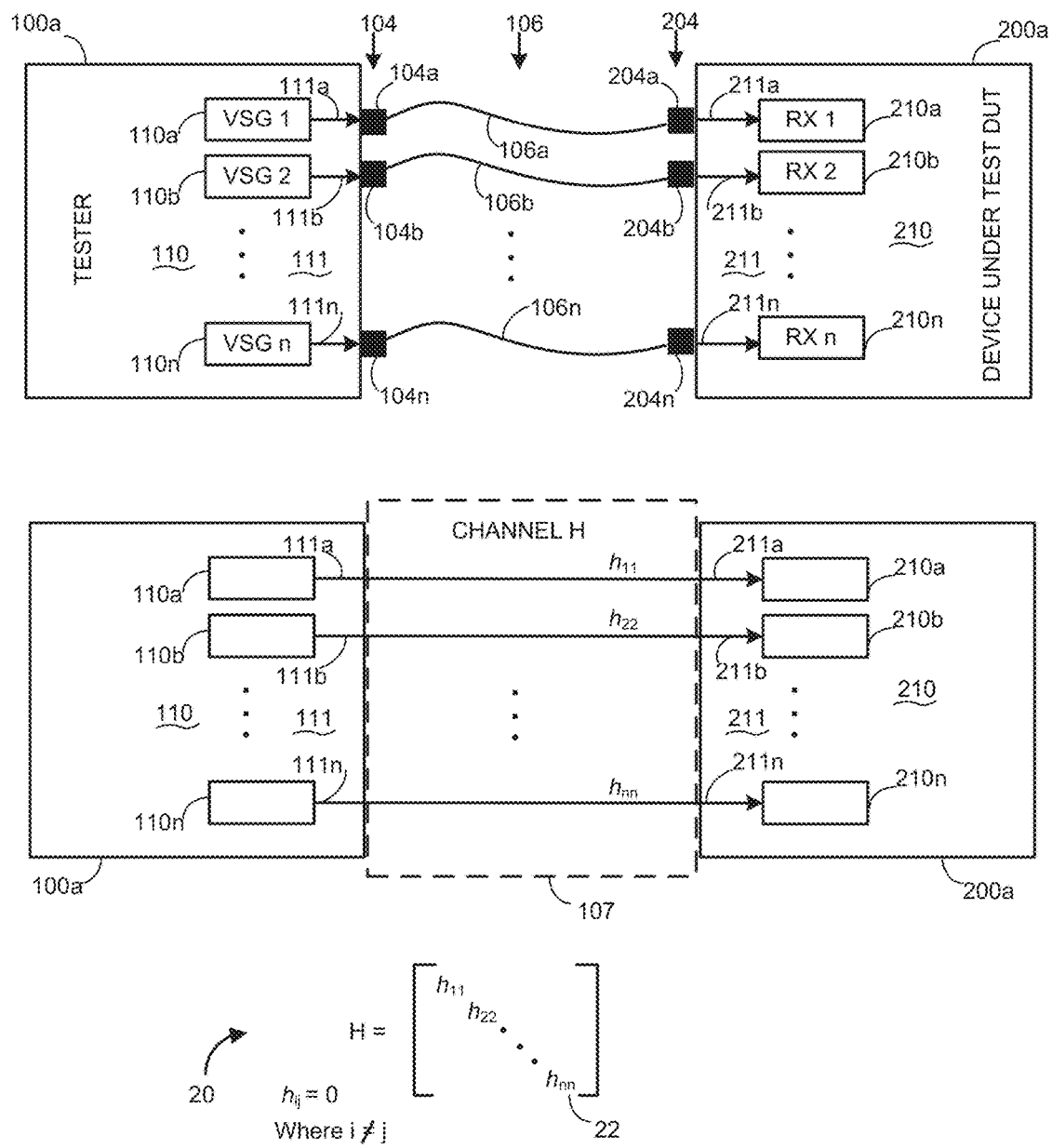
FIG. 3 depicts a testing environment for a MIMO wireless signal transceiver using conductive signal paths and a channel model for such testing environment.

Referring to FIG. 3, the additional test time for connecting and disconnecting test cabling becomes even longer when testing a MIMO DUT 200a. In such cases, multiple test cables 106 are needed to connect corresponding tester 104 and DUT 204 connectors to enable conveyance of the RF test signals from the RF signal sources 110 (e.g., VSGs) within the tester 100a for reception by the RF signal receivers 210 within the DUT 200a. For example, in a typical testing environment, the tester for testing MIMO devices will have one or more VSGs 110a, 110b, . . . , 110n providing corresponding one or more RF test signals 111a, 111b, . . . , 111n (e.g., packet data signals having variable signal power, packet contents and data rates). Their corresponding test cables 106a, 106b, . . . , 106n, connected via respective tester 104a, 104b, . . . , 104n and DUT 204a, 204b, . . . , 204n connectors, convey these signals to provide the received RF test signals 211a, 211b, . . . , 211n for the corresponding RF signal receivers 210a, 210b, . . . , 210n within the DUT 200a. Accordingly, the additional test time required for connecting and disconnecting these test cables 106 can be increased by a factor n corresponding to the number of test cables 106.

As discussed above, using test cables for connecting the tester 100a and DUT 200a does have the advantage of providing consistent, reliable, and repeatable test connections. As is well known in the art, these test connections 107 can be modeled as a signal channel H characterized by a diagonal matrix 20, where the diagonal matrix elements 22 correspond to the coefficients $h_{11}$, $h_{22}$, . . . , $h_{nn}$, for the respective signal channel characteristics (e.g., signal path conductivities or losses for the respective test cables 106).

Figure 4:
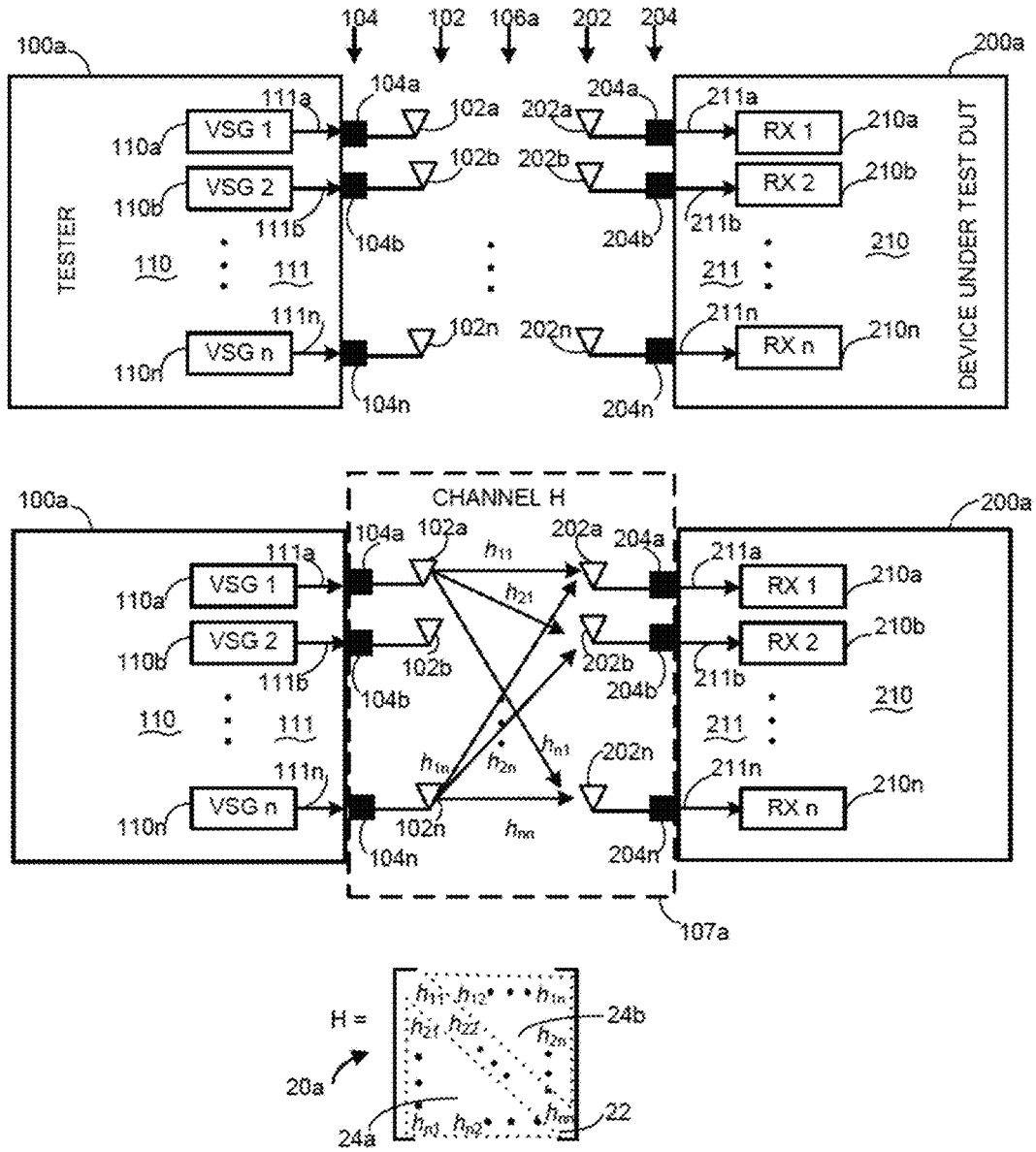
FIG. 4 depicts a testing environment for a MIMO wireless signal transceiver using radiated electromagnetic signals a channel model for such testing environment.

Referring to FIG. 4, in accordance with one or more exemplary embodiments, the conductive, or wired, channel 107 (FIG. 3) is replaced by a wireless channel 107a corresponding to a wireless signal interface 106a between the tester 100a and DUT 200a. As discussed above, the tester 100a and DUT 200a communicate test signals 111, 211 via respective arrays of antennas 102, 202. In this type of test environment, the signal channel 107a is no longer represented by a diagonal matrix 20, but is instead represented by a matrix 20a having one or more non-zero coefficients 24a, 24b off of the diagonal 22. As will be readily understood by one skilled in the art, this is due to the multiple wireless signal paths available in the channel 107a. For example, unlike a cabled signal environment in which, ideally, each DUT connector 204 receives only the signal from its corresponding tester connector 104. In this wireless channel 107a, the first DUT antenna 202a receives test signals radiated by all of the tester antennas 102a, 102b, . . . , 102n, e.g., corresponding to channel H matrix coefficients $h_{11}$, $h_{12}$, . . . , and $h_{1n}$.

In accordance with well known principles, the coefficients h of the channel matrix H correspond to characteristics of the channel 107a affecting transmission and reception of the RF test signals. Collectively, these coefficients h define the channel condition number k(H), which is the product of the norm of the H matrix and the norm of the inverse of the H matrix, as represented by the following equation:

$$k(H) = ||H|| * ||H^{-1}||$$

The factors affecting these coefficients can alter the channel condition number in ways that can create measurement errors. For example, in a poorly conditioned channel, small errors can cause large errors in the testing results. Where the channel number is low, small errors in the channel can produce small measurements at the receive (RX) antenna. However, where the channel number is high, small errors in the channel can cause large measurement errors at the receive antenna. This channel condition number k(H) is also sensitive to the physical positioning and orientation of the DUT within its testing environment (e.g., a shielded enclosure) and the orientation of its various antennas 204. Accordingly, even if with no extraneous interfering signals originating elsewhere or arriving via reflections and impinging on the receive antennas 204, the likelihood of repeatable accurate test results will be low.

Figure 5:
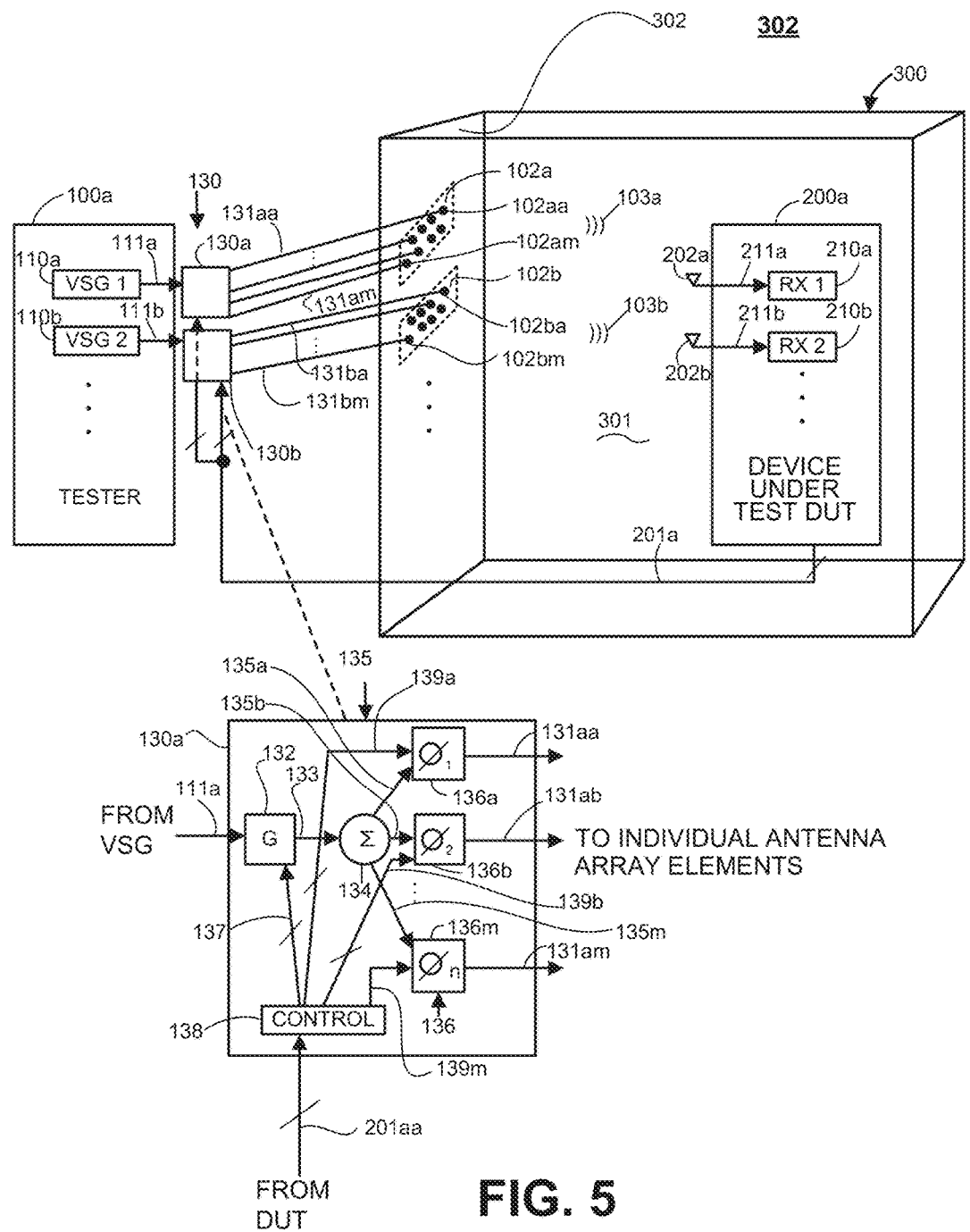
FIG. 5 depicts a testing environment in accordance with exemplary embodiments in which a MIMO DUT can be tested using radiated electromagnetic test signals.

Referring to FIG. 5, in accordance with one or more exemplary embodiments, the test signal interface between the tester 100a and DUT 200a can be wireless. The DUT 200a is placed within the interior 301 of a shielded enclosure 300. Such shielded enclosure 300 can be implemented as a metallic enclosure, e.g., similar in construction or at least in effect to a Faraday cage. This isolates the DUT 200a from radiated signals originating from the exterior region 302 of the enclosure 300. In accordance with exemplary embodiments, the geometry of the enclosure 300 is such that it functions as a closed-ended waveguide.

Elsewhere, e.g., disposed within or on an opposing interior surface 302 of the enclosure 300, are multiple (n) antennas arrays 102a, 102b, . . . , 102n, each of which radiates multiple phase-controlled RF test signals 103a, 103b, . . . , 103n (discussed in more detail below) originating from the test signal sources 110a, 110b, . . . , 110n within the tester 100a. Each antenna array includes multiple (M) antenna elements. For example, the first antenna array 102a includes m antenna elements 102aa, 102ab, . . . 102am. Each of these antenna elements 102aa, 102ab, . . . , 102am is driven by a respective phase-controlled RF test signal 131aa, 131ab, . . . , 131am provided by respective RF signal control circuitry 130a.

As depicted in the example of the first RF signal control circuitry 130a, the RF test signal 111a from the first RF test signal source 110a has its magnitude increased (e.g., amplified) or decreased (e.g., attenuated) by signal magnitude control circuitry 132. The resulting magnitude-controlled test signal 133 is replicated by signal replication circuitry 134 (e.g., a signal divider). The resulting magnitude-controlled, replicated RF test signals 135a, 135b, . . . , 135m have their respective signal phases controlled (e.g., shifted) by respective phase control circuits 136a, 136b, . . . , 136m to produce magnitude- and phase-controlled signals 131aa, 131ab, . . . , 131am to drive the antenna elements 102aa, 102ab, . . . , 102am of the antenna array 102a.

The remaining antenna arrays 102b, . . . , 102n and their respective antenna elements are driven in a similar manner by corresponding RF signal control circuits 130b, . . . , 130m. This produces corresponding numbers of composite radiated signals 103a, 103b, . . . , 103n for conveyance to and reception by the antennas 202a, 202b, . . . , 202n of the DUT 200a in accordance with the channel H matrix, as discussed above. The DUT 200a processes its corresponding received test signals 211a, 211b, . . . , 211m and provides one or more feedback signals 201a indicative of the characteristics (e.g., magnitudes, relative phases, etc.) of these received signals. These feedback signals 201a are provided to control circuitry 138 within the RF signal control circuits 130. This control circuitry 138 provides control signals 137, 139a, 139b, . . . , 139m for the magnitude control circuitry 132 and phase control circuitry 136. Accordingly, a closed loop control path is provided, thereby enabling gain and phase control of the individual radiated signals from the tester 100a for reception by the DUT 200a. (Alternatively, this control circuitry 130 can be included as part of the tester 100a.)

In accordance with well-known channel optimization techniques, the control circuitry 138 uses this feedback data 201a from the DUT 200a to achieve optimal channel conditions by altering the magnitudes and phases of the radiated signals in such a manner as to minimize the channel condition number k(H), and produce received signals, as measured at each DUT antenna 202, having approximately equal magnitudes. This will create a communication channel through which the radiated signals produce test results substantially comparable to those produced using conductive signal paths (e.g., RF signal cables).

This operation by the control circuitry 138 of the RF signal control circuitry 130, following successive transmissions and channel condition feedback events, will vary the signal magnitude and phase for each antenna array 102a, 102b, . . . , 102n to iteratively achieve an optimized channel condition number k(H). Once such an optimized channel condition number k(H) has been achieved, the corresponding magnitude and phase settings can be retained and the tester 100a and DUT 200a can continue thereafter in a sequence of tests, just as would be done in a cabled testing environment.

In practice, a reference DUT can be placed in a test fixture within the shielded enclosure 300 for use in optimizing the channel conditions through the iterative process discussed above. Thereafter, further DUTs of the same design can be successively tested without having to execute channel optimization in every instance, since differences in path loss experienced in the controlled channel environment of the enclosure 300 should be well within normal testing tolerances.

Referring still to FIG. 5, for example, an initial transmission was modeled to produce a channel condition number of 13.8 db, and the magnitudes of the $h_{11}$ and $h_{22}$ coefficients were −28 db and −28.5 db, respectively. The magnitude matrix for the channel H would be represented as follows:

$$H dB = \begin{bmatrix} -28 & -34.2 \\ -29.8 & -28.5 \end{bmatrix} \quad k(H) = 13.8 \text{ dB}$$

After iterative adjustments of magnitude and phase, as discussed above, the channel condition number k(H) was reduced to 2.27 db, and the amplitudes of the $h_{11}$ and $h_{22}$ coefficients were −0.12 db and −0.18 db, respectively, producing a channel magnitude matrix as follows:

$$H_{dB} = \begin{bmatrix} -0.12 & -13.68 \\ -15.62 & -0.18 \end{bmatrix} \quad k(H) = 2.27 \text{ dB}$$

These results are comparable to those of a cabled testing environment, thereby indicating that such a wireless testing environment can provide test results of comparable accuracy. By eliminating time for connecting and disconnecting cabled signal paths, and factoring in the reduced time for gain and phase adjustments, the overall received signal test time is significantly reduced.

Figure 6:
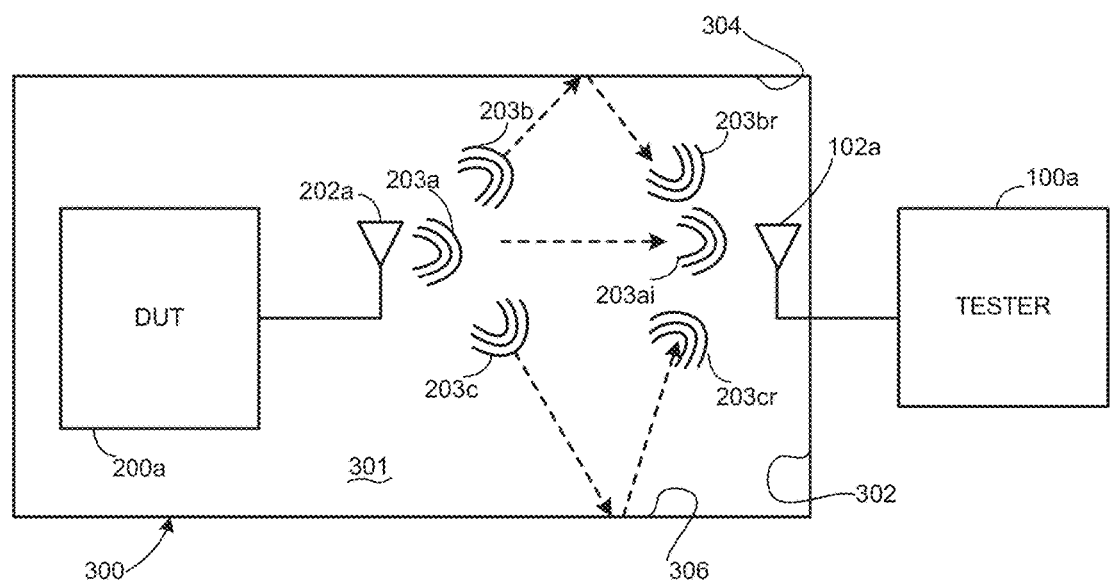
FIG. 6 depicts a testing environment in which a DUT is tested using radiated electromagnetic test signals within a shielded enclosure.

Referring to FIG. 6, influences of multipath signal effects upon the channel condition can be better understood. As discussed above, once disposed within the interior 301 of the enclosure 300, the DUT 200a, during transmit testing, radiates an electromagnetic signal 203a from each antenna 202a. This signal 203a includes components 203b, 203c that radiate outwardly and away from the antenna 102a of the tester 100a. However, these signal components 203b, 203c are reflected off of interior surfaces 304, 306 of the enclosure 300 and arrive as reflected signal components 203br, 203cr to combine, constructively or destructively, depending upon the multipath signal conditions, with the main incident signal component 203ai. As discussed above, depending upon the constructive and destructive nature of the interference, test results will generally tend to be unreliable and inaccurate for use in proper calibration and performance verification.

Figure 7:
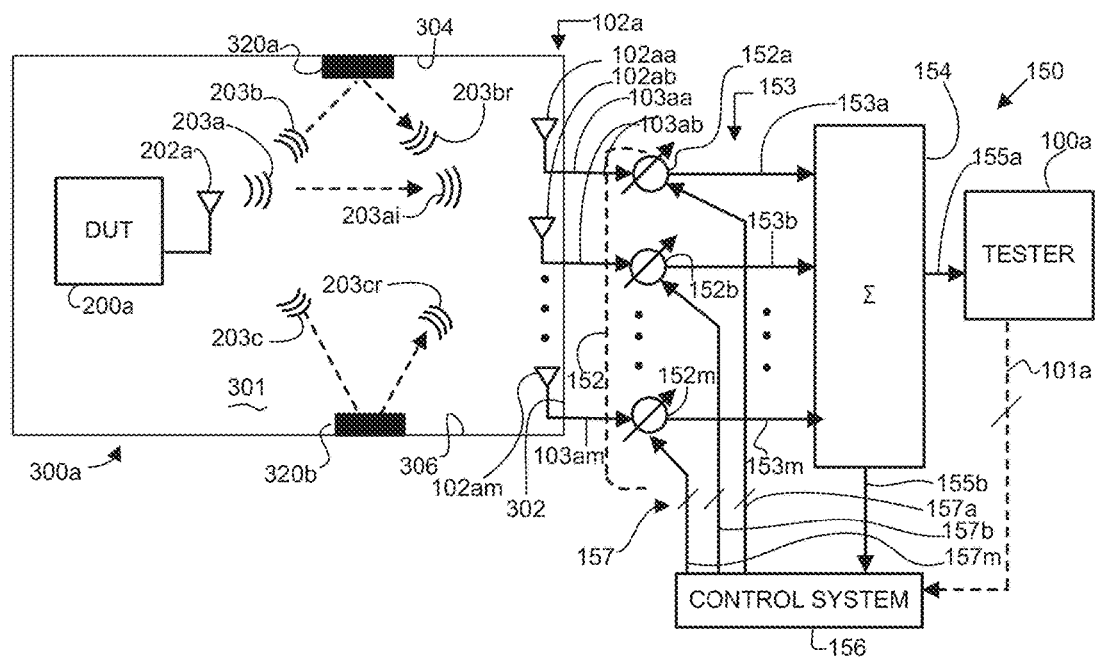
FIGS. 7 and 8 depict exemplary embodiments of testing environments in which a wireless DUT is tested using radiated electromagnetic test signals in a shielded enclosure with reduced multipath signal effects.

Referring to FIG. 7, in accordance with an exemplary embodiment, RF absorbent materials 320a, 320b are disposed at the reflective surfaces 304, 306. As a result, the reflected signal components 203br, 203cr are attenuated significantly, thereby producing less interference, either constructively or destructively, with the incident primary signal component 203ai.

Additional RF signal control circuitry 150 can be included for use between the antenna array 102a mounted within the interior 301 or on the interior surface 302 of the enclosure 300a and the tester 100a. (Alternatively, this additional control circuitry 150 can be included as part of the tester 100a.) The radiated signals impinging upon the antenna elements 102aa, 102ab, . . . , 102am produce received signals 103aa, 103ab, . . . , 103am with respective signal phases controlled (e.g., shifted) by phase control circuitry 152 having phase control elements 152a, 152b, . . . , 152m controlled in accordance with one or more phase control signals 157a, 157b, . . . , 157m provided by a control system 156. The resulting phase-controlled signals 153 are combined in a signal combiner 154 to provide the received signal 155a for the tester 100a and a feedback signal 155b for the control system 156. The control system 156 processes this feedback signal 155b, as part of a closed loop control network, to adjust, as needed, the respective phases of the composite receive signals 103aa, 103ab, . . . , 103am to minimize the apparent signal path loss associated with the interior region 301 of the enclosure 300a. This closed loop control network also allows the system to reconfigure the phased array enabled by these antennas 102a and phase control circuitry 152 in the event that the positioning or orientation of the DUT 200a changes within the enclosure 300a. As a result, following minimization of the path loss using this feedback loop, accurate and repeatable conveyance of the DUT signal 203a to the tester 100a using the radiated signal environment within the enclosure 300a can be achieved.

Figure 8:
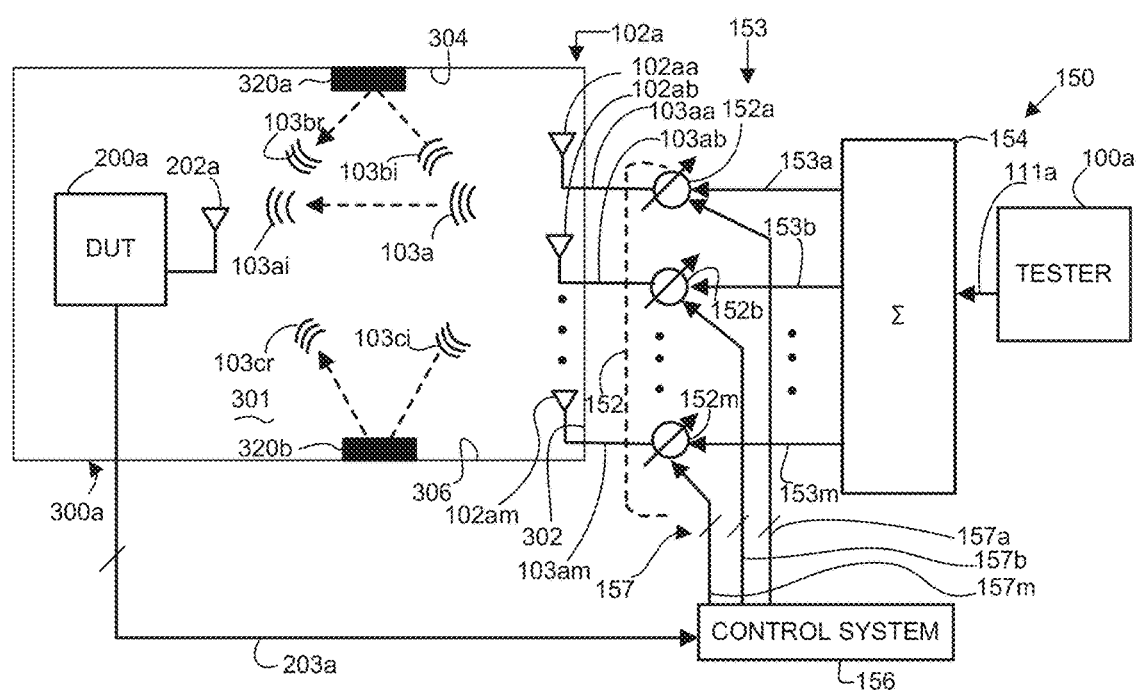

Referring to FIG. 8, similar control and improvement in producing accurate and repeatable test results can be achieved for DUT receive signal testing. In this case, the test signal 111a provided by the tester 100a is replicated by the signal combiner/splitter 154, and the respective phases of the replicated test signals 153 are adjusted as necessary by the phase control circuitry 152 before being radiated by the antenna elements 102aa, 102ab, . . . , 102am. As in the previous case, the reflected signal components 103br, 103cr are significantly attenuated and result in reduced constructive and destructive interference with the primary incident signal component 103ai. One or more feedback signals 203a from the DUT 200a provide the control system 156 with the information necessary for controlling the phases of the replicated test signals 153 to minimize the apparent signal path loss associated with the interior 301 of the enclosure 300a, thereby establishing consistent and repeatable signal path loss conditions.

Figure 9:
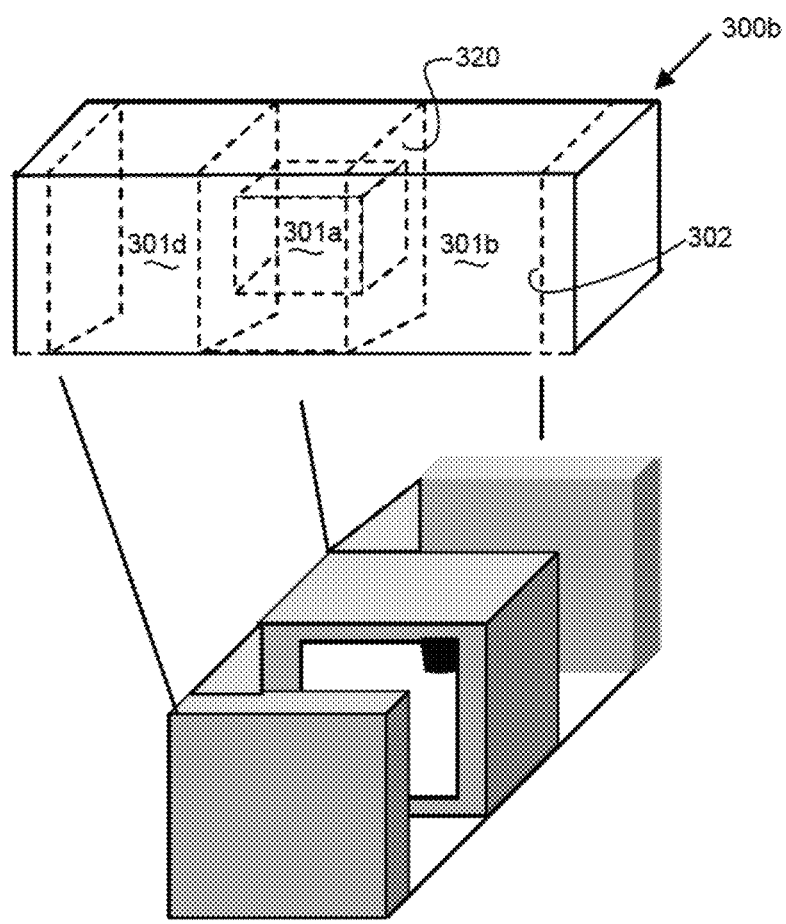
FIG. 9 depicts a physical representation of a shielded enclosure in accordance with an exemplary embodiment for use in the testing environments of FIGS. 7 and 8.

Referring to FIG. 9, in accordance with one or more exemplary embodiments, the shielded enclosure 300b can be implemented substantially as shown. As discussed above, the DUT can be positioned at one end 301d of the interior 301 of the enclosure 300b, opposite of the interior region 301b containing or facing the interior surface 302 on which the tester antenna arrays 102a, 102b, . . . , 102n (FIG. 5) are located. In between is an interior region 301a forming a waveguide cavity surrounded by the RF absorbent materials 320.

Various other modifications and alterations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a system to facilitate wireless testing of a radio frequency (RF) signal transceiver device under test (DUT), comprising:
   a structure defining interior and exterior regions with said interior region substantially isolated from electromagnetic radiation originating from said exterior region, wherein said interior region includes
      a first interior location configured to allow placement of a DUT,
      a second interior location distal from said first interior location, and
      one or more RF absorbent materials disposed substantially lateral to a defined volume between said first and second interior locations;
   an electrically conductive signal path to provide a wired connection to said DUT and convey one or more electrical signals between said interior and exterior regions;
   a plurality of antennas disposed at least partially at said second interior location to radiate a plurality of phase-controlled RF test signals to said DUT, and
   RF signal control circuitry coupled to said electrically conductive signal path and said plurality of antennas, and responsive to a plurality of signal data from said DUT related to said plurality of phase-controlled RF test signals and conveyed via said one or more electrical signals, and to a RF test signal by
      replicating said RF test signal to provide a plurality of replica RF test signals, and
      controlling, in accordance with said plurality of signal data, respective phases of at least a portion of said plurality of replica RF test signals to provide said plurality of phase-controlled RF test signals.

2. The apparatus of claim 1, wherein said controlling, in accordance with said plurality of signal data, respective phases of at least a portion of said plurality of replica RF test signals to provide said plurality of phase-controlled RF test signals comprises iteratively controlling said respective phases of at least a portion of said plurality of replica RF test signals.

3. The apparatus of claim 1, wherein:
   said defined volume between said first and second interior locations defines at least a portion of a wireless signal path; and
   said one or more RF absorbent materials reduce reflections within said defined volume of said radiated plurality of phase-controlled RF test signals.

4. The apparatus of claim 3, wherein:
   said wireless signal path has a RF signal path loss associated therewith; and
   said controlling, in accordance with said plurality of signal data, respective phases of at least a portion of said plurality of replica RF test signals to provide said plurality of phase-controlled RF test signals comprises iteratively controlling said respective phases of at least a portion of said plurality of replica RF test signals to reduce said RF signal path loss.

5. The apparatus of claim 1, wherein said RF signal control circuitry is further responsive to said plurality of signal data from said DUT by controlling, in accordance with said plurality of signal data, respective magnitudes of at least a portion of said plurality of replica RF test signals.

6. The apparatus of claim 5, wherein said controlling, in accordance with said plurality of signal data, respective phases and magnitudes of at least a portion of said plurality of replica RF test signals to provide said plurality of phase-controlled RF test signals comprises iteratively controlling said respective phases and magnitudes of at least a portion of said plurality of replica RF test signals.

7. The apparatus of claim 5, wherein: said defined volume between said first and second interior locations defines at least a portion of a wireless signal path; and said one or more RF absorbent materials reduce reflections within said defined volume of said radiated plurality of phase-controlled RF test signals.

8. The apparatus of claim 7, wherein:
   said wireless signal path has a RF signal path loss associated therewith; and
   said controlling, in accordance with said plurality of signal data, respective phases of at least a portion of said plurality of replica RF test signals to provide said plurality of phase-controlled RF test signals comprises iteratively controlling said respective phases and magnitudes of at least a portion of said plurality of replica RF test signals to reduce said RF signal path loss.

9. The apparatus of claim 1, wherein said RF signal control circuitry comprises RF signal phase control circuitry responsive to a first one or more control signals related to said plurality of signal data by controlling said respective phases of at least a portion of said plurality of replica RF test signals.

10. The apparatus of claim 9, wherein said RF signal control circuitry further comprises RF signal amplifier circuitry responsive to a second one or more control signals related to said plurality of signal data by controlling said respective magnitudes of at least a portion of said plurality of replica RF test signals.

11. A method of facilitating wireless testing of a radio frequency (RF) multiple-input, multiple-output (MIMO) signal transceiver device under test (DUT) comprising:
   providing a structure defining interior and exterior regions with said interior region substantially isolated from electromagnetic radiation originating from said exterior region, wherein said interior region includes
      a first interior location configured to allow placement of a DUT, a second interior location distal from said first interior location, and one or more RF absorbent materials disposed substantially lateral to a defined volume between said first and second interior locations;

providing an electrically conductive signal path to couple to said DUT and convey one or more electrical signals between said interior and exterior regions;

providing a plurality of antennas disposed at least partially at said second interior location to radiate a plurality of phase-controlled RF test signals; and responding to a plurality of signal data from said DUT related to said plurality of phase-controlled RF test signals and conveyed via said one or more electrical signals, and to a RF test signal by replicating said RF test signal to provide a plurality of replica RF test signals, and controlling, in accordance with said plurality of signal data, respective phases of at least a portion of said plurality of replica RF test signals to provide said plurality of phase-controlled RF test signals.

12. The method of claim 11, wherein said controlling, in accordance with said plurality of signal data, respective phases of at least a portion of said plurality of replica RF test signals to provide said plurality of phase-controlled RF test signals comprises iteratively controlling said respective phases of at least a portion of said plurality of replica RF test signals.

13. The method of claim 11, wherein: said defined volume between said first and second interior locations defines at least a portion of a wireless signal path; and said one or more RF absorbent materials reduce reflections within said defined volume of said radiated plurality of phase-controlled RF test signals.

14. The method of claim 13, wherein: said wireless signal path has a RF signal path loss associated therewith; and said controlling, in accordance with said plurality of signal data, respective phases of at least a portion of said plurality of replica RF test signals to provide said plurality of phase-controlled RF test signals comprises iteratively controlling said respective phases of at least a portion of said plurality of replica RF test signals to reduce said RF signal path loss.

15. The method of claim 11, further comprising responding to said plurality of signal data from said DUT by controlling, in accordance with said plurality of signal data, respective magnitudes of at least a portion of said plurality of replica RF test signals.

16. The method of claim 15, wherein said controlling, in accordance with said plurality of signal data, respective phases and magnitudes of at least a portion of said plurality of replica RF test signals to provide said plurality of phase-controlled RF test signals comprises iteratively controlling said respective phases and magnitudes of at least a portion of said plurality of replica RF test signals.

17. The method of claim 15, wherein:
said defined volume between said first and second interior locations defines at least a portion of a wireless signal path; and
said one or more RF absorbent materials reduce reflections within said defined volume of said radiated plurality of phase-controlled RF test signals.

18. The method of claim 17, wherein:
said wireless signal path has a RF signal path loss associated therewith; and
said controlling, in accordance with said plurality of signal data, respective phases of at least a portion of said plurality of replica RF test signals to provide said plurality of phase-controlled RF test signals comprises iteratively controlling said respective phases and magnitudes of at least a portion of said plurality of replica RF test signals to reduce said RF signal path loss.

19. The method of claim 11, wherein said controlling, in accordance with said plurality of signal data, respective phases of at least a portion of said plurality of replica RF test signals to provide said plurality of phase-controlled RF test signals comprises responding to a first one or more control signals related to said plurality of signal data by controlling said respective phases of at least a portion of said plurality of replica RF test signals.

20. The method of claim 19, further comprising responding to a second one or more control signals related to said plurality of signal data by controlling said respective magnitudes of at least a portion of said plurality of replica RF test signals.

* * * * *